US010515818B2

(12) United States Patent
Liu et al.

(10) Patent No.: US 10,515,818 B2
(45) Date of Patent: Dec. 24, 2019

(54) SEMICONDUCTOR METHODS AND DEVICES

(71) Applicant: Taiwan Semiconductor Manufacturing Company, Ltd., Hsin-Chu (TW)

(72) Inventors: Chi-Kang Liu, Taipei (TW); Jr-Jung Lin, Hsin-Chu (TW); Huan-Just Lin, Hsin-Chu (TW); Ming-Hsi Yeh, Hsin-Chu (TW); Sung-Hsun Wu, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 15/418,416

(22) Filed: Jan. 27, 2017

(65) Prior Publication Data

US 2018/0151382 A1   May 31, 2018

Related U.S. Application Data

(60) Provisional application No. 62/427,411, filed on Nov. 29, 2016.

(51) Int. Cl.

| H01L 21/308 | (2006.01) |
| H01L 21/033 | (2006.01) |
| H01L 21/66 | (2006.01) |
| H01L 21/3213 | (2006.01) |
| H01L 21/306 | (2006.01) |
| H01L 21/3065 | (2006.01) |
| H01L 29/66 | (2006.01) |

(52) U.S. Cl.
CPC ...... *H01L 21/3088* (2013.01); *H01L 21/0337* (2013.01); *H01L 21/3065* (2013.01); *H01L 21/3081* (2013.01); *H01L 21/3085* (2013.01); *H01L 21/3086* (2013.01); *H01L 21/30604* (2013.01); *H01L 21/32139* (2013.01); *H01L 22/12* (2013.01); *H01L 22/20* (2013.01); *H01L 29/66795* (2013.01)

(58) Field of Classification Search
CPC . H01L 21/3088; H01L 21/3086; H01L 22/20; H01L 29/66795; H01L 21/0337; H01L 22/12

See application file for complete search history.

(56) References Cited

U.S. PATENT DOCUMENTS

| 7,534,725 | B2 | 5/2009 | Shen et al. |
| 8,487,378 | B2 | 7/2013 | Goto et al. |
| 8,729,634 | B2 | 5/2014 | Shen et al. |
| 8,826,213 | B1 | 9/2014 | Ho et al. |
| 8,852,673 | B2 | 10/2014 | Laing et al. |
| 8,887,106 | B2 | 11/2014 | Ho et al. |
| 9,029,263 | B1 * | 5/2015 | Kim ............... H01L 21/823437 438/694 |

(Continued)

*Primary Examiner* — Jamie C Niesz
(74) *Attorney, Agent, or Firm* — Slater Matsil, LLP

(57) ABSTRACT

To pattern a gate electrode, a mandrel of material is initially deposited and then patterned. In an embodiment the patterning is performed by performing a first etching process and to obtain a rough target and then to perform a second etching process with different etch parameters to obtain a precise target. The mandrel is then used to form spacers which can then be used to form masks to pattern the gate electrode.

20 Claims, 11 Drawing Sheets

(56) References Cited

U.S. PATENT DOCUMENTS

| | | | |
|---|---|---|---|
| 2002/0052113 A1* | 5/2002 | Khan | H01L 21/3065 438/689 |
| 2010/0009470 A1* | 1/2010 | Davis | B82Y 10/00 438/9 |
| 2014/0282326 A1 | 9/2014 | Chen et al. | |
| 2014/0377928 A1* | 12/2014 | Hu | H01L 21/76229 438/381 |
| 2015/0162206 A1* | 6/2015 | Liao | H01L 21/3088 438/703 |
| 2016/0247685 A1* | 8/2016 | Chen | H01L 21/3086 |

\* cited by examiner

SEMICONDUCTOR METHODS AND DEVICES

PRIORITY CLAIM

This application claims the benefit of U.S. Provisional Application No. 62/427,411, filed on Nov. 29, 2016 and entitled "Semiconductor Methods and Devices," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
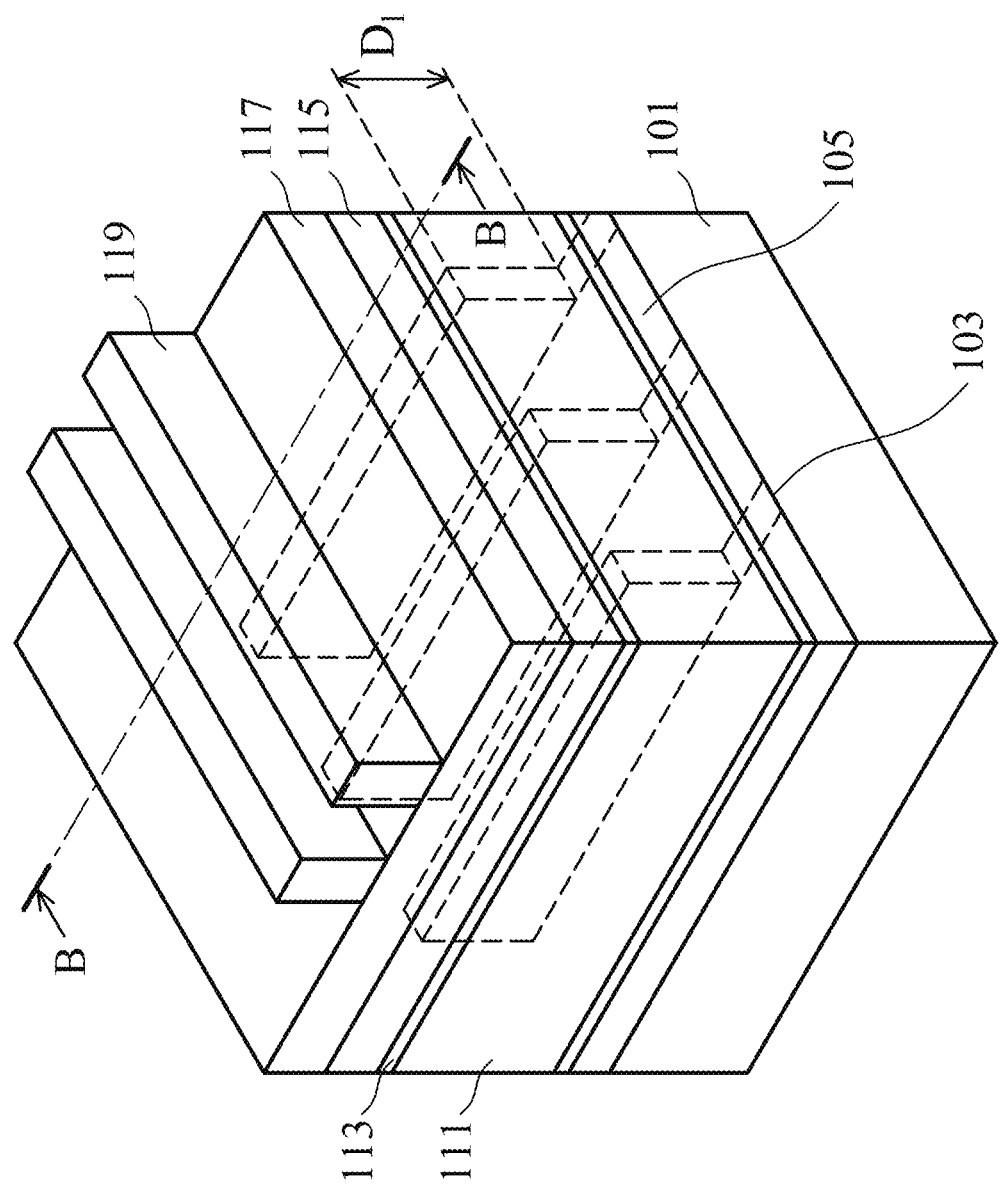
FIGS. 1A-1B illustrate a mandrel material over a gate electrode material in accordance with some embodiments.

The following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment, such as a fin field effect transistor (FinFET). Embodiments may also be applied, for example, in other ways, such as a planar transistor.

Figure 1B:
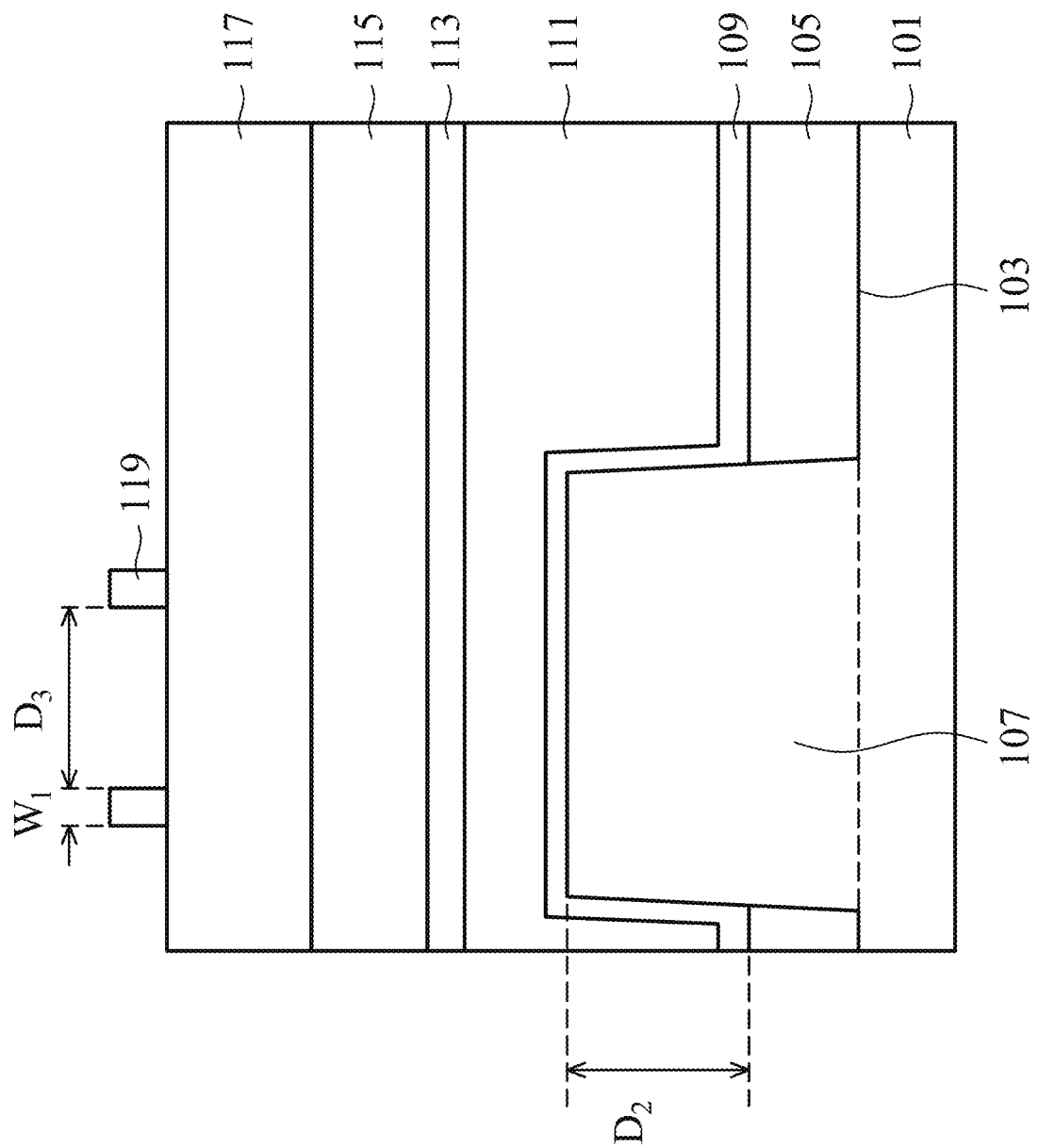

With reference now to FIGS. 1A-1B, where FIG. 1B is a cross-sectional view of FIG. 1A along line B-B', there is illustrated a substrate 101 with first trenches 103 and fins 107 (with FIG. 1B illustrating additional material to each side of fins 107 that would otherwise block the view in FIG. 1A). The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIGS. 1A-1B) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first distance $D_1$ of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 are formed may be utilized. Any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication may or may not be present. These fins 107 may be used, as discussed below, to form the channel region of multiple-gate FinFET transistors. While FIG. 1A only illustrates three fins 107 formed from the substrate 101, any number of fins 107 may be utilized.

The fins 107 may be formed such that they have a width at the surface of the substrate 101 of between about 1 nm and about 50 nm, such as about 10 nm. Additionally, the fins 107 may be spaced apart from each other by a distance of between about 1 nm and about 50 nm, such as about 20 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the high aspect ratio process), a high density plasma CVD method, or other suitable method of formation.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a second distance $D_2$ from the surface of the fins 107 of between about 40 Å and about 500 Å, such as about 42 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a gate dielectric material 109 and a gate electrode material 111 may be formed over each of the fins 107. In an embodiment the gate dielectric material 109 may be formed by thermal oxidation, chemical vapor deposition, sputtering, or any other suitable method. Depending on the technique of gate dielectric formation, the gate dielectric material 109 thickness on the top of the fins 107 may be different from the gate dielectric thickness on the sidewall of the fins 107.

The gate dielectric material 109 may comprise a material such as silicon dioxide or silicon oxynitride with a thickness ranging from about 3 angstroms to about 100 angstroms, such as about 10 angstroms. In another embodiment, the gate dielectric material 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the gate dielectric material 109.

The gate electrode material 111 may comprise a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode material 111 may be deposited by chemical vapor deposition (CVD), sputter deposition, or other suitable techniques for depositing conductive materials. The thickness of the gate electrode material 111 may be in the range of about 100 nm to about 200 nm, such as about 160 nm. The top surface of the gate electrode material 111 may have a non-planar top surface, and may be planarized prior to patterning of the gate electrode material 111 or gate etch. Ions may or may not be introduced into the gate electrode material 111 at this point. Ions may be introduced, for example, by ion implantation techniques.

Once formed, additional materials may be formed over the gate dielectric material 109 and the gate electrode material 111 as part of a patterning of the gate dielectric material 109 and the gate electrode material 111. Once patterned, the gate dielectric material 109 and the gate electrode material 111 will form multiple channel regions located on each side of the fins 107 beneath the gate dielectric material 109. In an embodiment the patterning may be initiated by depositing a first hardmask 113 and a second hardmask 115 over the gate electrode material 111.

In an embodiment the first hardmask 113 comprises a dielectric material such as silicon nitride, silicon oxynitride, silicon, silicon oxide, titanium nitride, tantalum nitride, tungsten, combinations of these, or the like. The first hardmask 113 may be formed using a process such as chemical vapor deposition, plasma enhanced chemical vapor deposition, atomic layer deposition, or the like, and may be formed to a thickness of between about 10 Å and about 1000 Å, such as about 200 Å. However, any other suitable material and method of formation may be utilized.

Once the first hardmask 113 has been formed, the second hardmask 115 is formed over the first hardmask 113. In an embodiment the second hardmask 115 may be a material different from the first hardmask 113, such as silicon oxide, silicon, silicon nitride, titanium nitride, tantalum nitride, tungsten, combinations of these, or the like, formed through a deposition process such as chemical vapor deposition or physical vapor deposition, or may be formed through a deposition process. The second hardmask 115 may be formed to have a thickness of between about 100 Å and about 5000 Å, such as about 900 Å. However, any suitable material, process of formation, and thickness may be utilized.

FIGS. 1A-1B also illustrate a placement and patterning of a mandrel material 117 and a first photoresist 119 over the second hardmask 115. In an embodiment the mandrel material 117 may be a dummy material such as dummy amorphous silicon, dummy polysilicon (DPO), or other material that may be patterned. The mandrel material 117 may be deposited using a deposition process such as chemical vapor deposition (CVD), physical vapor deposition (PVD), combinations of these, or the like, to a thickness of between about 100 Å and about 5000 Å, such as about 1000 Å. However, any suitable material, method of deposition, or thickness may be utilized.

Once the mandrel material 117 has been formed, the first photoresist 119 is placed over the mandrel material 117. In an embodiment the first photoresist 119 is a tri-layer photoresist, with a bottom anti-reflective coating (BARC) layer, an intermediate mask layer, and a top photoresist layer (not separately illustrated within FIGS. 1A-1B). However, any suitable type of photosensitive material or combination of materials may be utilized.

Once the first photoresist 119 has been placed over the mandrel material 117 and the second hardmask 115, the first photoresist 119 is patterned. In an embodiment the first photoresist 119 may be patterned by exposing a photosensitive material within the first photoresist 119 (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the first photoresist 119 such that the physical properties of the exposed portions of the first photoresist 119 are different from the physical properties of the unexposed portions of the first photoresist 119. The first photoresist 119 may then be developed with, e.g., a developer (not separately illustrated), in order to separate the exposed portion of the first photoresist 119 from the unexposed portion of the first photoresist 119.

In an embodiment the first photoresist 119 may be patterned such that the first photoresist 119 can be used to pattern the mandrel material 117 for use in the patterning process. As such, the first photoresist 119 may be formed to have a first width $W_1$ of between about 1 nm and about 100 nm, such as about 59 nm. Additionally, separate portions of the first photoresist 119 may be formed to be separated by a third distance $D_3$ of between about 1 nm and about 50 nm, such as about 10 nm. However, any suitable dimensions may be utilized.

After patterning of the first photoresist 119, an after development inspection (ADI) is performed in order to capture and obtain critical dimension information of the first photoresist 119, such as first photoresist critical dimension information. In an embodiment the ADI may be performed using a defect scanning tool such as a scanning electron microscope method, either in-line or off-line, an optical critical dimension method, combinations of these, or the like. However, any suitable method of obtaining critical dimension information of the first photoresist 119 after development may be obtained.

Figure 2:
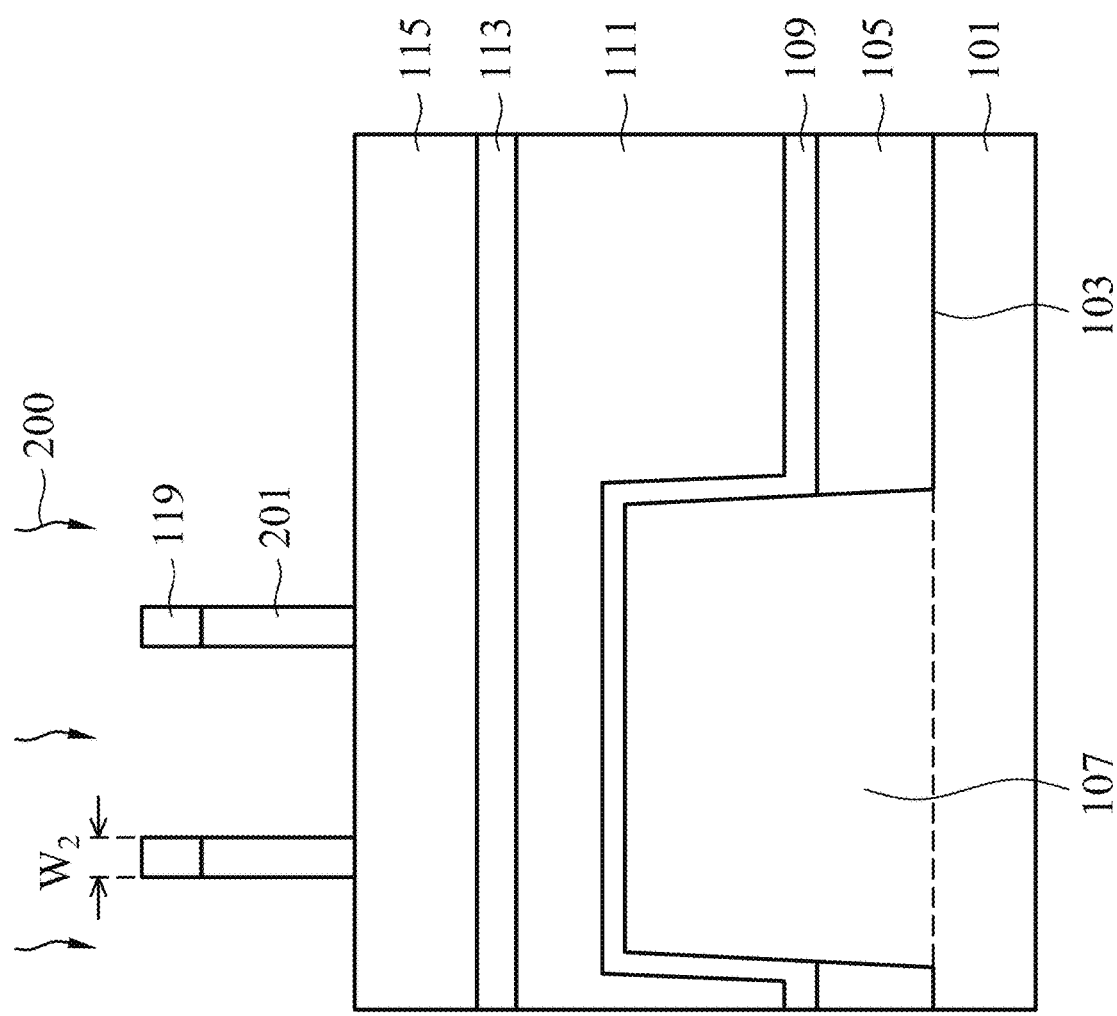
FIG. 2 illustrates a first etch process to etch the mandrel material in accordance with some embodiments.

FIG. 2 illustrates the start of a patterning process that will be used to transfer the pattern of the first photoresist 119 to the mandrel material 117 and form mandrels 201. In an embodiment the patterning process may be initiated with a first etching process 200 that has a first desired etching characteristic. For example, in one embodiment the first etching process 200 may be an anisotropic dry etch, such as a reactive ion etch (RIE) that may be used in order to initiate a transfer of the pattern from the first photoresist 119 to the mandrel material 117 to form the mandrels 201. However, any suitable etching processes may be utilized.

Additionally, in order to assist in the achievement of the desired dimensions, advanced process controls (APC) may be utilized during the first etching process 200. For example, a series of models and feedback systems may receive the first photoresist critical dimension information (from the ADI described above). Once the APC has received the first photoresist critical dimension information, the APC may utilize the first photoresist critical dimension information in conjunction with other process parameters, such as parameters determined from previous process runs, to determine and set the various process parameters (e.g., power, flow rates, temperature, pressure, etc.) for the first etching process 200. An etching tool (not separately illustrated in FIG. 2) may then receive the process parameters (adjusted for the first photoresist critical dimension information) and perform the first etching process 200 based on those adjusted process parameters.

However, the use of the advanced process controls, even with the measurement and use of the first photoresist critical dimension information, coupled with the first photoresist 119, is imperfect. For example, the first etching process 200, even with the use of advanced process control and after development inspection, is able to achieve a control sensitivity 0.30 nm/sec, with a control unit of 1.0 seconds, a trim curve ($R^2$) of 0.9386, and a trim curve line between a dry process time in seconds and a critical dimension in nanometers with a linear equation of about y=0.304x+31.612. Such control sensitivity can lead to less control of the overall process and higher defects as dimensions are further reduced.

Because of this, instead of the mandrels 201 having the same width and spacing as the overlying pattern of the first photoresist 119, the mandrels 201 may have a second width $W_2$ of between about 1 nm and about 100 nm, such as about 35 nm. However, any suitable dimensions may be utilized.

Figure 3:
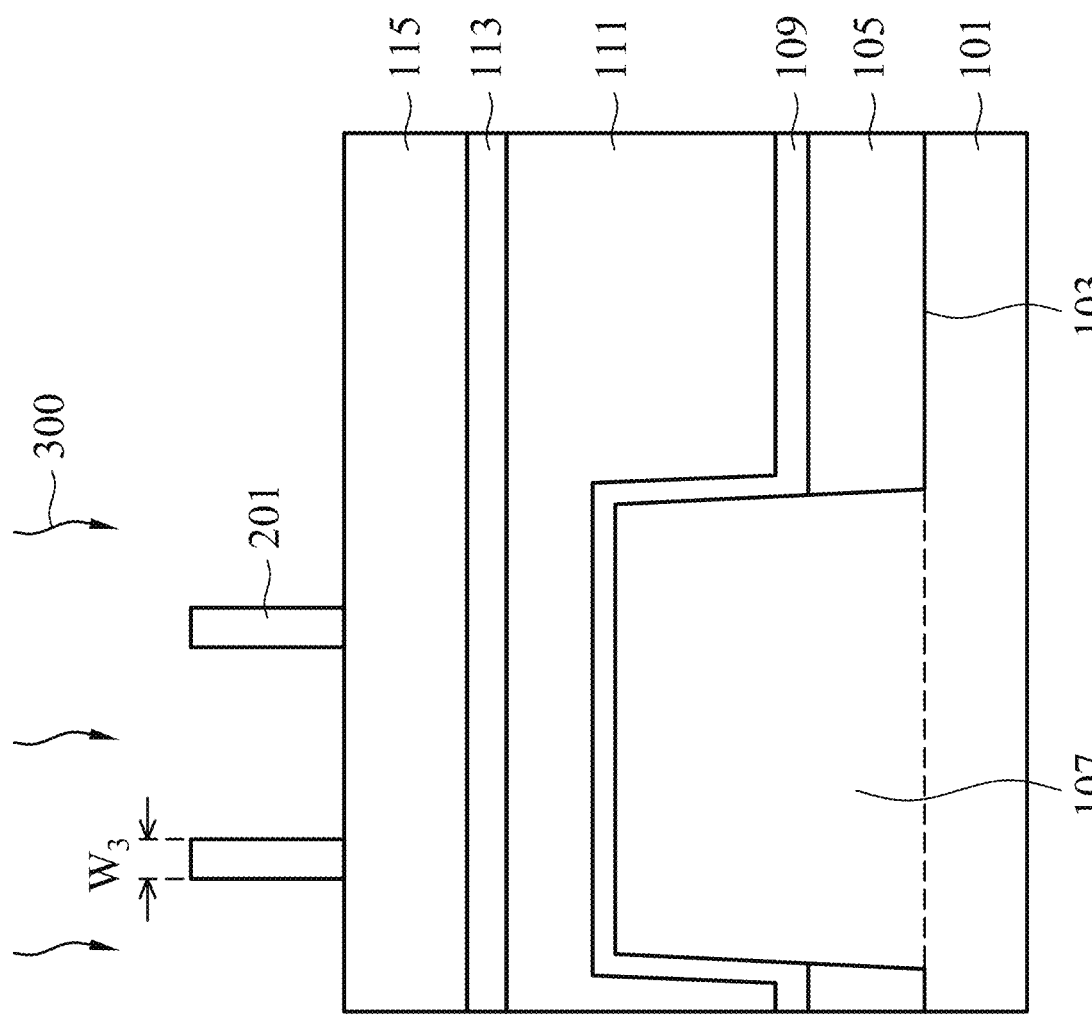
FIG. 3 illustrates a second etch process to etch the mandrel material in accordance with some embodiments.

FIG. 3 illustrates that, once the mandrels 201 have been formed, the first photoresist 119 may be removed from the mandrels 201. In an embodiment, a plasma ashing process may be used to remove the first photoresist 119, whereby the temperature of the first photoresist 119 may be increased until the first photoresist 119 experiences a thermal decomposition and may be removed. However, any other suitable process, such as a wet strip, may be utilized.

Once the first photoresist 119 has been removed, an after etch inspection (AEI) may be performed in order to capture and obtain critical dimension information of the mandrels 201 after they have been formed. In an embodiment the AEI is utilized to determine how well the first etching process 200 was able to achieve the desired critical dimensions for the mandrels 201. For example, the AEI may measure the actual width of the mandrels 201 after the first etching process 200 and determine a first offset from how far away the actual width of the mandrels 201 are from a desired width. Such information may then be forwarded to a second etching unit for use in a second etching process 300 (described further below with respect to FIG. 3).

In an embodiment the AEI is performed using an electron beam inspection tool (e.g., a scanning electron microscopy tool). In other embodiments, optical inspection tools (e.g., optical diffraction tools, optical reflection tools, optical scattering tools, etc.), or combinations of both electron beam and optical tools, or the like, may be used. However, any suitable tool or process may be utilized to perform the after etch inspection. In an embodiment in which the mandrel material 117 is polysilicon and the first etching process 200 is a dry etch, the first offset may be between about 1 nm and about 100 nm, such as about 24 nm.

FIG. 3 further illustrates that, once the first offset has been obtained from the AEI, a second etching process (represented in FIG. 3 by the wavy lines labeled 300) may be utilized to modify the pattern of the mandrels 201 to correct for the first offset and achieve a precise target critical dimension for the mandrels 201. In an embodiment the second etching process 300 is an etching process that has one or more different control parameters from the first etching process 200. For example, in an embodiment in which the first etching process 200 is an etching process with a first control sensitivity, the second etching process 300 may be an etching process with a second control sensitivity different from the first control sensitivity.

For example, in an embodiment in which the mandrels are polysilicon and the first etching process 200 is a dry etch with a control sensitivity of 0.30 nm/sec, the second etching process 300 may be an etching process with a smaller control sensitivity. In a particular embodiment the second etching process 300 may be a wet etching process (also with advanced process controls) with a first etchant that has a control sensitivity of less than 0.1 nm/sec, such as 0.09 nm/sec, along with a control unit of 0.1 seconds, a trim curve ($R^2$) of about 0.9929, and a trim curve line between a process time in seconds and a critical dimension in nanometers with a linear equation of about y=0.0861x−0.1193. For example, in an embodiment in which the mandrels 201 are polysilicon, the second etching process 300 may be a wet etch (using a wet etch tool either incorporated or separate from the dry etch tool of the first etching process 200) wherein the first etchant is HF (0.01%-100%), $O_3$ (0.1 ppm-70 ppm), $NH_4OH$ (0.01%-100%), HCl (0.01%-100%), $H_2O_2$ (0.01%-100%), $H_2SO_4$ (0.01%-100%), combinations of these, or the like. Additionally, the wet etching process may be performed at a temperature of between about 0° C. and about 100° C., such as about 70° C. However, any suitable etchants and process parameters may be utilized.

By utilizing the second etching process 300 with a different control sensitivity, the results of the first etching process 200 may be modified based upon the first offset. For example, in an embodiment in which the second etching process 300 has a lower control sensitivity, such as a wet etch with a control sensitivity of 0.09 nm/sec, the reduced etching rate of the control sensitivity may be used along with the first offset to modify the critical dimensions of the mandrels 201. For example, the first offset may be used to set a time of the second etching process 300, which has a well-controlled sensitivity, in order to correct the first offset and obtain the overall desired critical dimensions for the mandrels 201. In a particular embodiment, the second etching process 300 may be used to obtain a final critical dimension such as a third width $W_3$ of between about 1 nm and about 100 nm, such as about 34 nm, although any suitable dimensions may be utilized.

By using two systems and performing the first etching process 200, measuring the result, and then modifying the result using the second etching process 300, a smaller variation in the desired dimensions of the mandrels 201, such as an even-odd of less than 1 nm, may be obtained. For example, with the first etching process by itself and for a target dimension of 27.60 nm, a mean dimension of 27.94 nm may be obtained along with a standard deviation of 0.38 and a range of 1.27 nm. However, by utilizing the first etching process 200 along with the second etching process 300, a target of 26.60 nm may achieve a mean of 26.60 nm along with a standard deviation of 0.27 and a range of 0.4 nm. As such, the dual etching approach can improve the range of about 70% (from 1.27 nm to 0.4 nm) and improve the standard deviation about 30% (from 0.38 to 0.27). Such improvements in the process control can lead to a smaller device and less defects in the manufacturing process.

Additionally, while the first etching process 200 and the second etching process 300 are described above as being a dry etching process and a wet etching process, these descriptions are intended to be illustrative in nature and are not intended to be limiting upon the embodiments. Rather, the first etching process 200 and the second etching process 300 are merely processes with different parameters and/or control sensitivities. For example, the first etching process 200 and the second etching process 300 may both be dry etching processes with separate process parameters, or the first etching process 200 and the second etching process 300 may both be wet etching processes with separate process parameters. Any suitable combination of processes with different parameters are fully intended to be included within the scope of the embodiments.

Finally, after the second etching process 300 has been performed, an after thinning inspection (ATI) may be performed to measure the critical dimensions of the mandrels 201 prior to further processing. In an embodiment the ATI is utilized to determine how well the first etching process 200 and the second etching process (in combination) were able to achieve the desired critical dimensions for the mandrels 201. For example, the ATI may measure the actual width of the mandrels 201 after the second etching process 300 and determine a first offset from how far away the actual width of the mandrels 201 are from a desired width.

Figure 4:
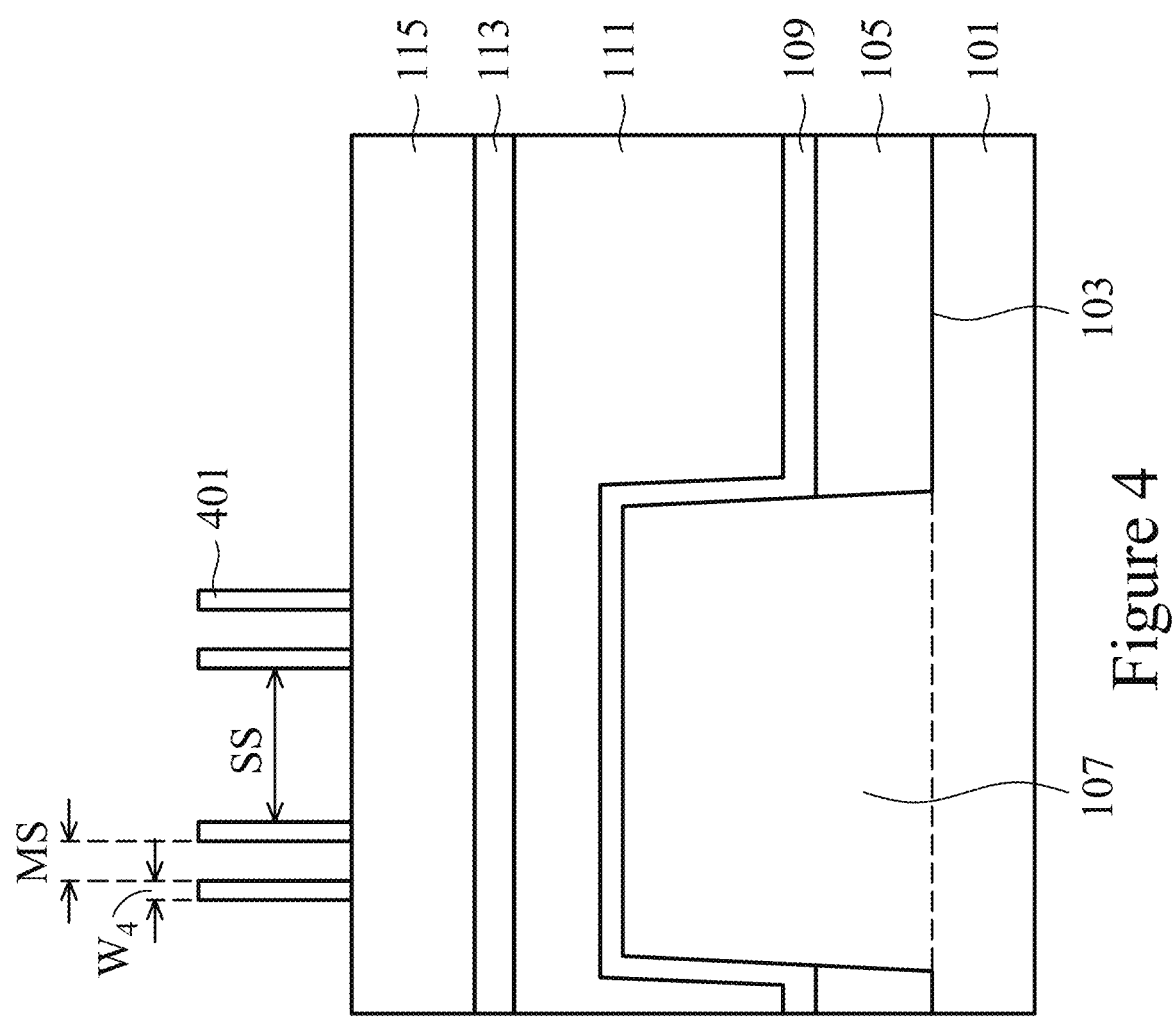
FIG. 4 illustrates a formation of spacers and a removal of the mandrel in accordance with some embodiments.

FIG. 4 illustrates that, once the mandrels 201 have been formed and modified as described above with respect to FIGS. 2-3, spacers 401 are formed on sidewalls of the mandrels 201 and the mandrels 201 are then removed. In an embodiment the spacers 401 are formed along the sidewalls of the mandrels 201 by initially blanket depositing a spacer layer (not shown) over the previously formed structure. The spacer layer may comprise SiN, oxynitride, SiC, SiON, oxide, and the like and may be formed by commonly used methods such as chemical vapor deposition (CVD), plasma enhanced CVD, sputter, or the like. The spacer layer may be formed to a thickness of between about 10 Å and about 700

Å, such as about 30 Å. The spacers 401 are then patterned, such as by anisotropically etching and removing the spacer layer from the horizontal surfaces of the structure.

Once the spacers 401 are formed, the mandrels 201 may be removed from between the spacers 401. In an embodiment the mandrels 201 may be removed using a wet etch, although any suitable etching technique, such as a dry etch, may alternatively be utilized. For example, if silicon is utilized to form the mandrels 201, then an etchant such as HF may be utilized to remove the mandrels 201 without significantly removing any of the spacers 401.

By using the mandrels 201 to form the spacers 401 and then removing the mandrels 201, a mask with smaller dimensions than the mandrels 201 (which may be limited by the lithography process utilized) may be obtained. For example, in an embodiment the spacers 401 may be formed to have a third width $W_3$ of between about 1 nm and about 100 nm, such as about 34 nm. Additionally, there may be a mandrel space MS of between about 1 nm and about 100 nm, such as about 36 nm, and a spacer space SS of between about 1 nm and about 100 nm, such as about 36 nm. However, any suitable dimensions may be utilized.

Figure 5:
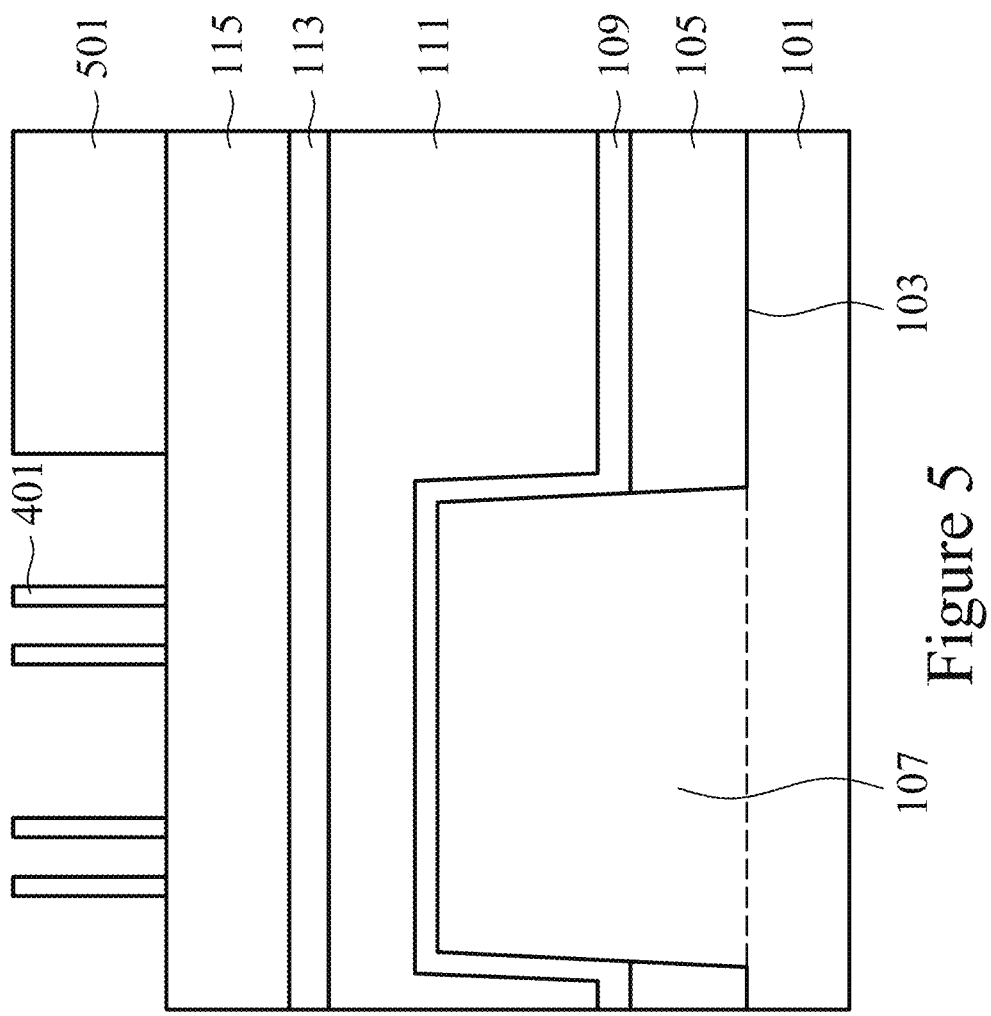
FIG. 5 illustrates a placement of a photoresist in accordance with some embodiments.

FIG. 5 illustrates that, once the spacers 401 have been formed, a second photoresist 501 may be formed in order to prepare the second hardmask 115 and the first hardmask 113 for patterning. In an embodiment the second photoresist 501 may be similar to the first photoresist 119 (described above with respect to FIGS. 1A-1B). For example, the second photoresist 501 may be a tri-layer photoresist, with a bottom anti-reflective coating (BARC) layer, an intermediate mask layer, and a top photoresist layer. However, any suitable photosensitive material or other patternable mask may be utilized.

Once the second photoresist 501 has been placed, the second photoresist 501 may be patterned in order to expose the first hardmask 113 and the second hardmask 115 over the fin 107. In an embodiment the second photoresist 501 may be patterned by exposing a photosensitive material within the second photoresist 501 (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the second photoresist 501 such that the physical properties of the exposed portions of the second photoresist 501 are different from the physical properties of the unexposed portions of the second photoresist 501. The second photoresist 501 may then be developed with, e.g., a second developer (not separately illustrated), in order to separate the exposed portion of the second photoresist 501 from the unexposed portion of the second photoresist 501.

Figure 6:
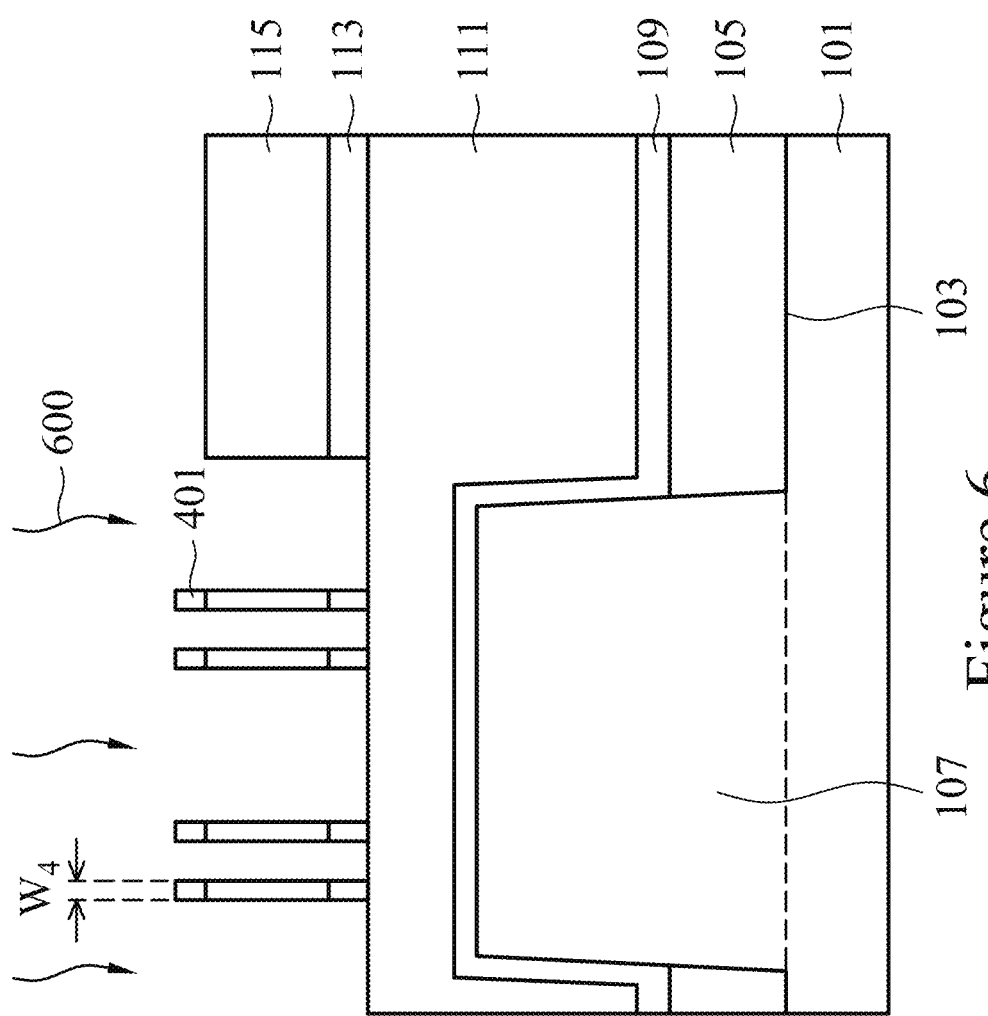
FIG. 6 illustrates a patterning of a hardmask in accordance with some embodiments.

FIG. 6 illustrates that, once the first hardmask 113 and the second hardmask 115 have been exposed, a third etching process (represented in FIG. 6 by the wavy lines labeled 600) is performed in order to transfer the pattern of the spacers 401 to the first hardmask 113 and the second hardmask 115. In an embodiment the third etching process 600 is one or more anisotropic etching processes such as a reactive ion etch using an etchant or etchants suitable for patterning the first hardmask 113 and the second hardmask 115. However, any suitable etching process may be utilized.

In an embodiment the first hardmask 113 and the second hardmask 115 may form a mask with a fourth width $W_4$ of between about 1 nm and about 100 nm, such as about 36 nm. Additionally, while the profile of the first hardmask 113 and the second hardmask 115 are illustrated in FIG. 6 as being square or rectangular in shape, this is merely intended to be illustrative and is not intended to be limiting to the embodiments. Rather, the first hardmask 113 and the second hardmask 115 may have any suitable profile, such as a trapezium profile or a triangular profile, and may have any suitable width.

Additionally, if the second photoresist 501 is not consumed during the third etching process 600, the second photoresist 501 may be removed after completion of the third etching process 600. In an embodiment, a plasma ashing process may be used to remove the second photoresist 501, whereby the temperature of the second photoresist 501 may be increased until the second photoresist 501 experiences a thermal decomposition and may be removed. However, any other suitable process, such as a wet strip, may alternatively be utilized.

Figure 7:
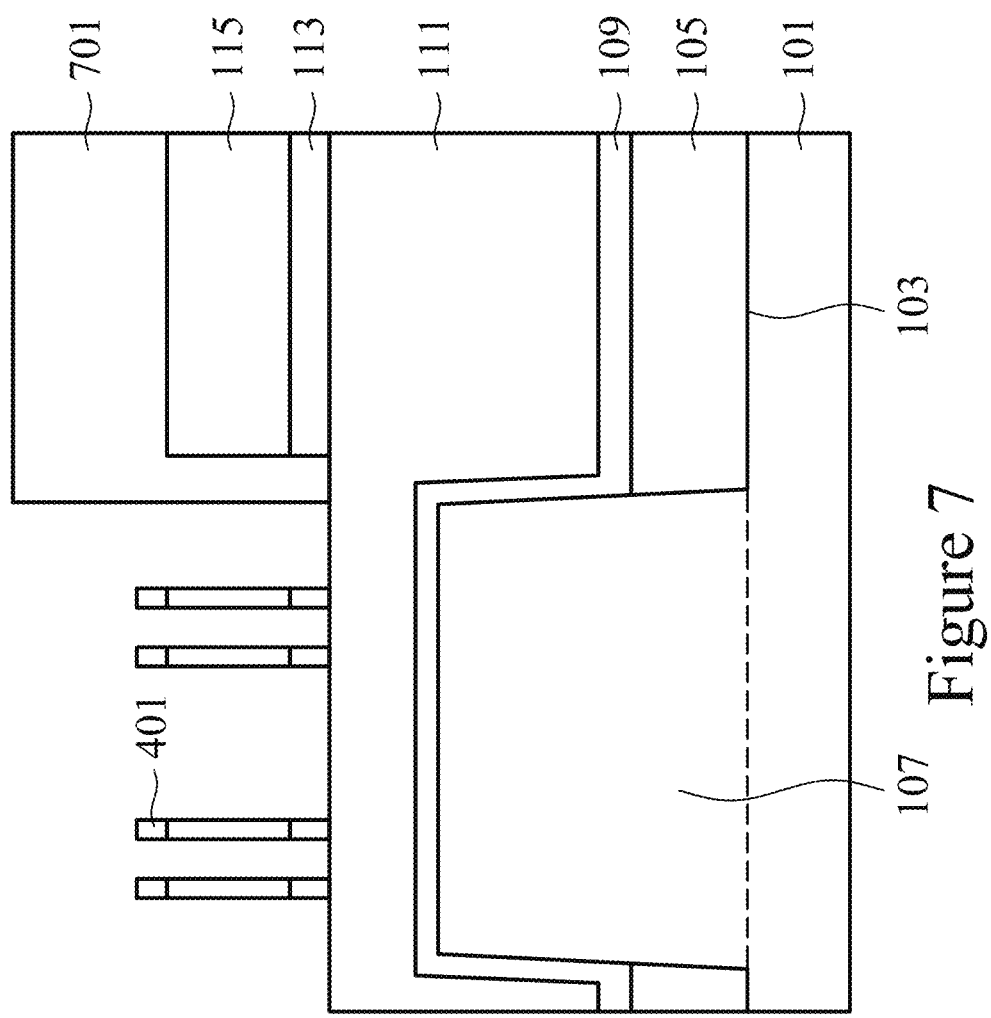
FIG. 7 illustrates a placement of a photoresist in accordance with some embodiments.

FIG. 7 illustrates a placement and patterning of a third photoresist 701 over the first hardmask 113 and the second hardmask 115 that is not located directly over the fin 107. In an embodiment the third photoresist 701 may be similar to the first photoresist 119 (described above with respect to FIGS. 1A-1B). For example, the third photoresist 701 may be a tri-layer photoresist, with a bottom anti-reflective coating (BARC) layer, an intermediate mask layer, and a top photoresist layer. However, any suitable photosensitive material or other patternable mask may be utilized.

Once the third photoresist 701 has been placed, the third photoresist 701 may be patterned in order to expose the first hardmask 113 and the second hardmask 115 over the fin 107. In an embodiment the third photoresist 701 may be patterned by exposing a photosensitive material within the third photoresist 701 (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the third photoresist 701 such that the physical properties of the exposed portions of the third photoresist 701 are different from the physical properties of the unexposed portions of the third photoresist 701. The third photoresist 701 may then be developed with, e.g., a third developer (not separately illustrated), in order to separate the exposed portion of the third photoresist 701 from the unexposed portion of the third photoresist 701.

Figure 8A:
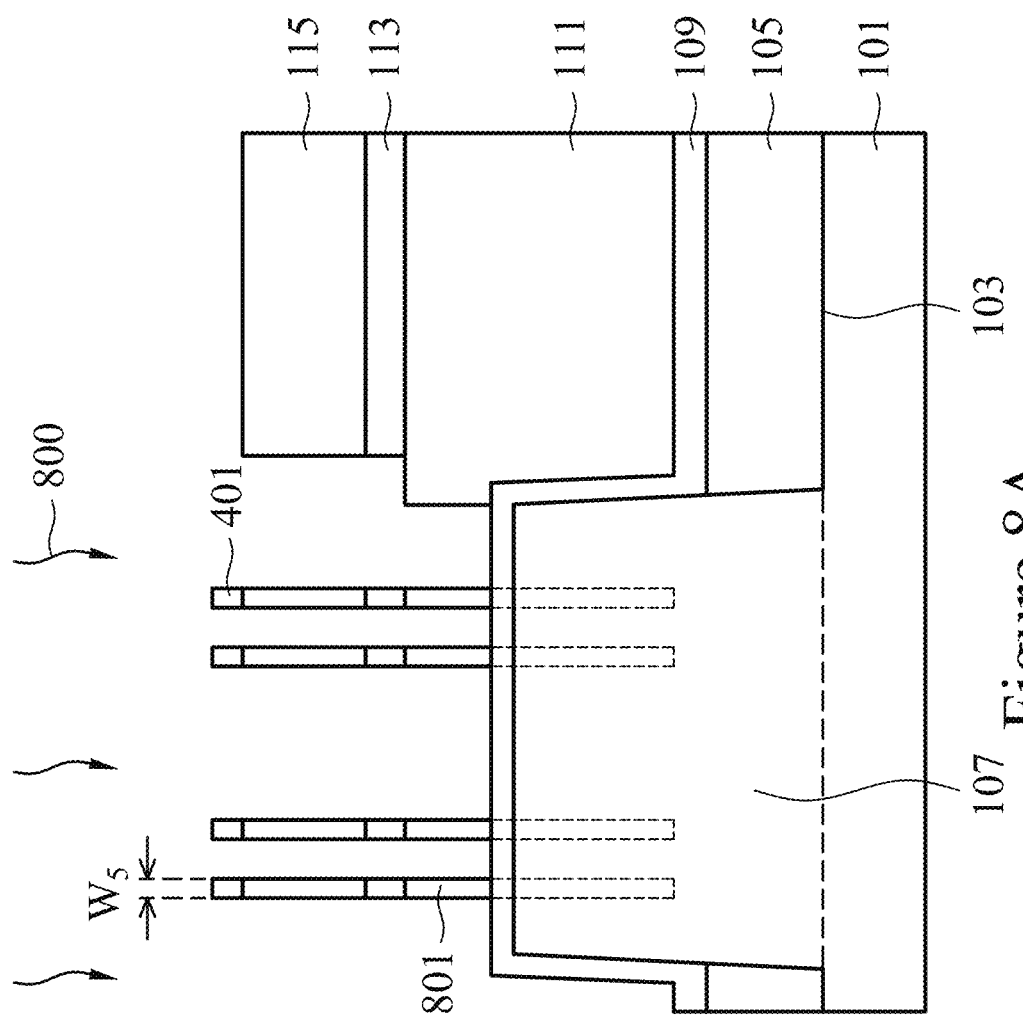
FIGS. 8A-8B illustrate a patterning of the gate electrode material in accordance with some embodiments.
Figure 8B:
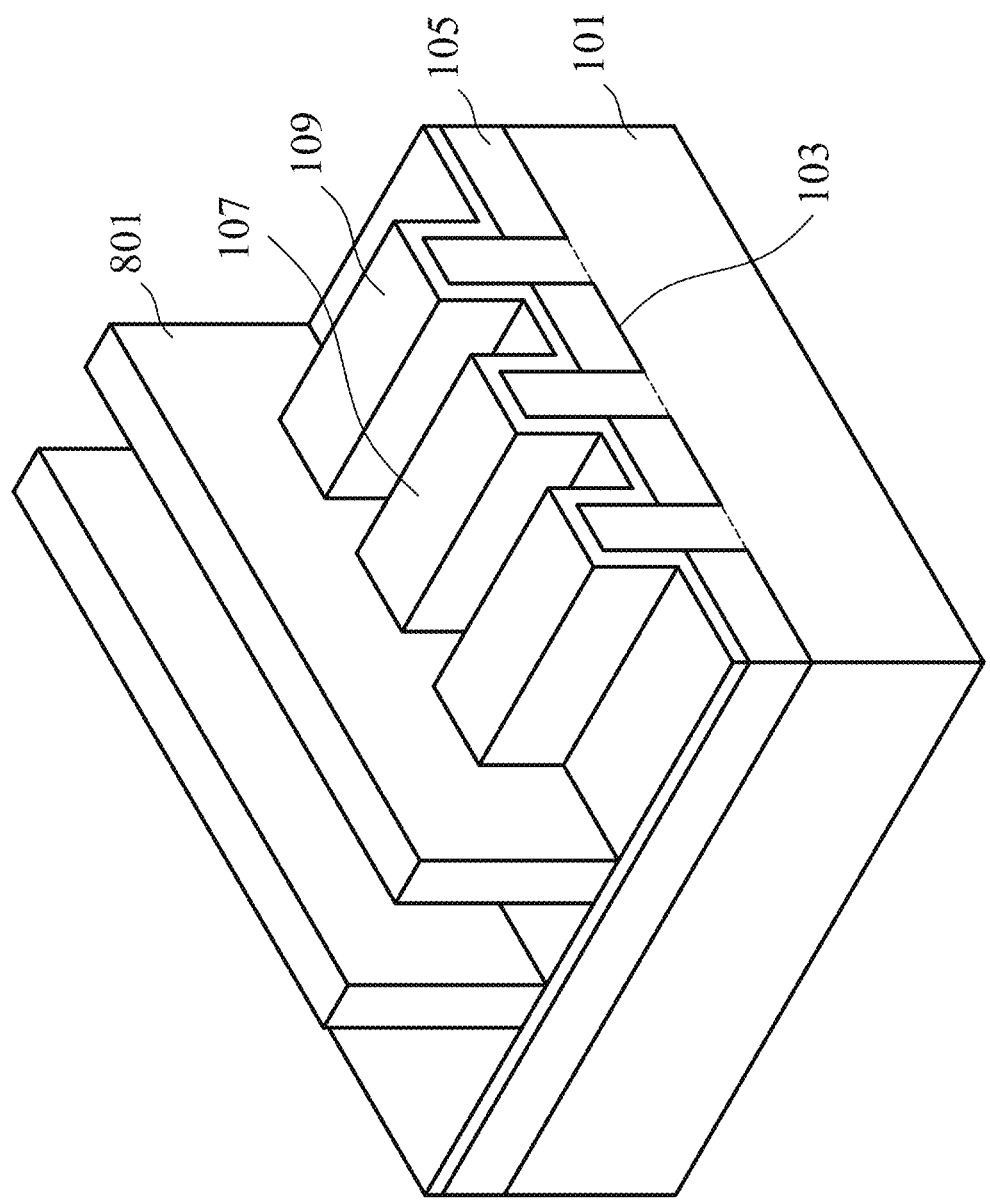

FIGS. 8A-8B illustrate that, once the first hardmask 113 and the second hardmask 115 have been exposed, a fourth etching process (represented in FIG. 8 by the wavy lines labeled 800) is performed in order to transfer the pattern of the first hardmask 113 and the second hardmask 115 to the gate electrode material 111 and form gate electrodes 801 (a portion of which that extends along the sidewalls of the fins 107 is reproduced in dashed line). In an embodiment the third etching process 600 is an anisotropic etching process such as a reactive ion etch, although any suitable etching process may be utilized.

By using the dual etching process to stabilize the etching rate during the formation of the mandrels 201, a more accurate control of the critical dimensions of the mandrels 201 may be achieved. By better controlling the critical dimensions of the mandrels 201, the mandrels 201 may be formed consistently smaller without defects occurring, allowing for an overall smaller feature to be manufactured using the mandrels 201. For example, the gate electrode 801 may be formed to a fifth width $W_5$ of between about 1 nm and about 100 nm, such as about 24 nm, although any suitable dimensions may be utilized.

Additionally, after the patterning of the gate electrode 801, additional processing may be performed in order to finish and connect the fin FET device formed using the gate electrodes 801. For example, the gate dielectric material 109 may be patterned using the gate electrode 801 as a mask, source/drain regions may be formed or grown, an interlayer dielectric may be formed over the gate electrode 801, and contacts to the gate electrode 801 and source/drain regions within the fins 107 may be formed. Any suitable process or structures may be formed to use and interconnect the finFET device, and all such processes and structures are fully intended to be included within the scope of the embodiments.

By utilizing the dual etching process as described above, a greater control over the critical dimensions may be achieved. Such an improvement may be applied to various technology nodes such as a 10 nm technology node, a 7 nm technology node, or other nodes either higher or lower. Additionally, embodiments may be applied to other patterning processes, such as a process to form mandrels that will be used to pattern the substrate 101 and define active areas (OD). These processes may be applied to any suitable patterning process.

Figure 9:
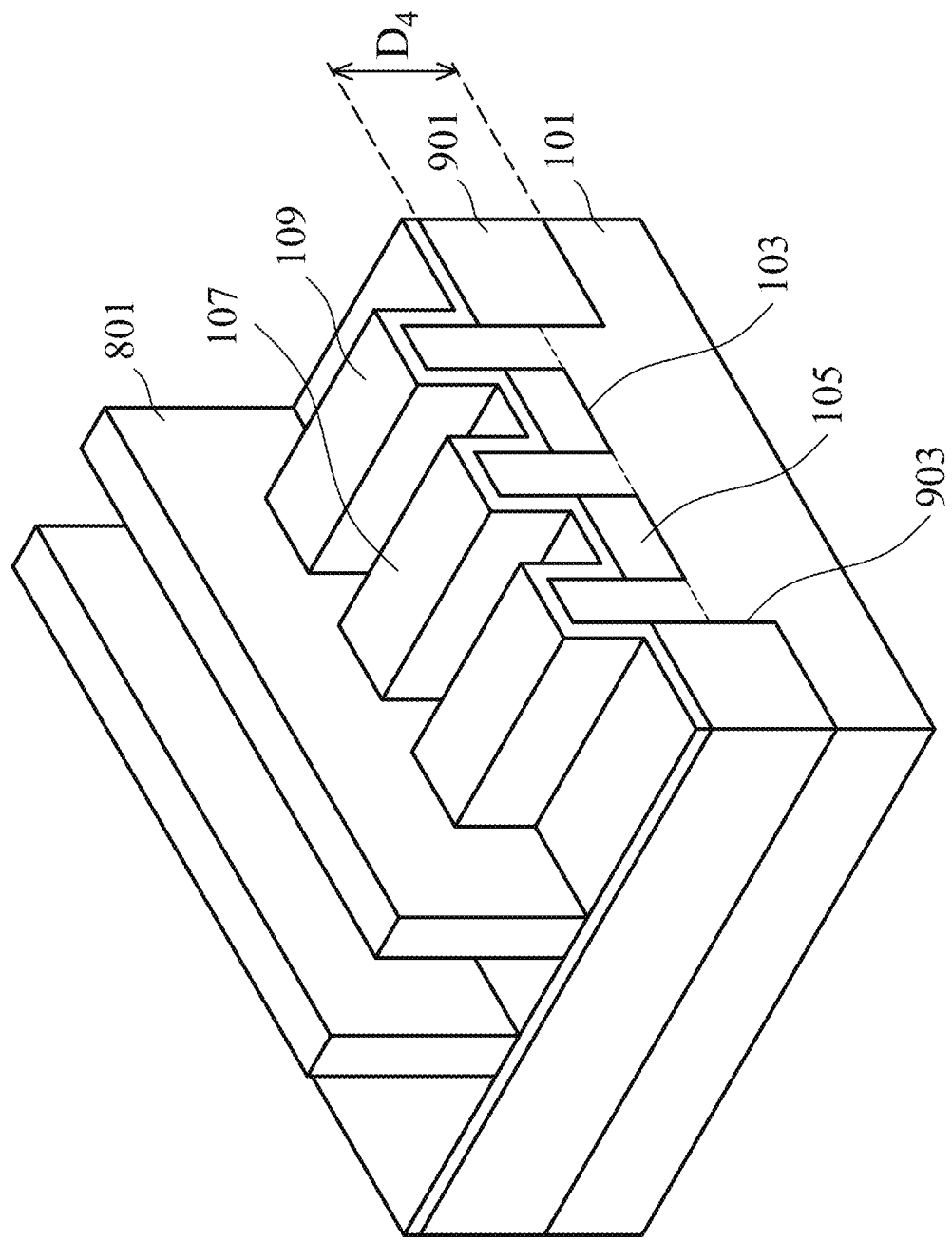
FIG. 9 illustrates another embodiment which uses multiple isolation regions with differing depths in accordance with some embodiments.

FIG. 9 illustrates another embodiment in which the first isolation regions 105 are used to isolate the fins 107 from each other, and second isolation regions 901 are used to isolate the fins 107 from other sections of the substrate 101 such as separate groupings of fins 107 (not separately illustrated). In this embodiment the second isolation regions 901 may be formed by initially forming second trenches 903. The second trenches 903 may be formed prior to, after, or even partially along with the first trenches 103, such as by using a photolithographic masking and etching process similar to the process described above with respect to the formation of the first trenches 103. For example, in one embodiment openings for the second trenches 903 may be initially made within the substrate 101 with a first masking and etching process and then these openings may be extended at the same time that the first trenches 103 are formed with a second masking and etching process. However, the second trenches 903 may be formed to extend a fourth distance $D_4$ from the top of the substrate 101 and the fins 107 that is deeper than the first distance $D_1$ of the first trenches 103. In a particular embodiment the first trenches 103 may be formed to have the first distance $D_1$ of between about 100 Å and about 1,500 Å, such as about 1,000 Å, and the second trenches 903 may be formed such that the fourth distance $D_4$ is between about 200 Å and about 7,000 Å, such as being between about 32 nm and about 36 nm, or being about 3,190 Å. However, any suitable depths may be utilized.

Once the second trenches 903 have been formed along with the first trenches 103, the first trenches 103 and the second trenches 903 may be filled with the dielectric material to form the first isolation regions 105 and the second isolation region 901. In an embodiment the first trenches 103 and the second trenches 903 may be filled as described above with respect to FIGS. 1A-1B. For example, the dielectric material may be deposited such that the dielectric material fills the first trenches 103 and the second trenches 903, and then the dielectric material may be recessed to expose the top surfaces of the fins 107 and form the first isolation regions 105 and the second isolation regions 901. Once the first isolation regions 105 and the second isolation regions 901 have been formed, processing may continue as described above.

By utilizing the second isolation regions 901 along with the first isolation regions 105, a better tuning of the isolation may be obtained. For example, the first isolation regions 105 may be tuned to the specific desires of intra-fin isolation (between fins 107 covered by a same gate electrode), while the second isolation regions 901 may be tuned to the specific desires of inter-fin isolation (between fins 107 covered by separated gate stacks, not separately illustrated). Such ability to tune the isolation regions allows for greater process variability.

In accordance with an embodiment, a method of manufacturing a semiconductor device comprising applying a dummy material over a hardmask and etching the dummy material with a first etching process is provided. The dummy material is etched with a second etching process based on results of the first etching process, wherein the second etching process has at least one process parameter different from the first etching process.

In accordance with another embodiment, a method of manufacturing a semiconductor device comprising forming a fin over a semiconductor substrate is provided. A gate electrode material is deposited over the fin, and a hard mask is deposited over the gate electrode material. Dummy material is deposited over the hard mask, and the dummy material is patterned, wherein the patterning the dummy material further comprises etching the dummy material with a first etch process, the first etch process having a first control sensitivity, and etching the dummy material with a second etch process to form a mandrel, the second etch process having a second control sensitivity different from the first control sensitivity.

In accordance with yet another embodiment, a method of manufacturing a semiconductor device comprising etching a dummy silicon material with a first etch process, wherein the dummy silicon material is located over a hardmask and a gate electrode material, the gate electrode material being located over a fin is provided. Dimensions of the dummy silicon material are measured after the first etch process has been finished, the measuring generating measurements, and the dummy silicon material is etched with a second etch process based at least in part on the measurements, wherein the second etch process has a smaller control sensitivity than the first etch process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
applying a dummy material over a hardmask;
applying a first photoresist over the dummy material;
patterning the first photoresist to form a first patterned photoresist, wherein the patterning forms the first patterned photoresist having a first width;
measuring the first width of the first patterned photoresist to generate a first measurement;

setting process parameters for a first etching process based on the first measurement of the first width of the first patterned photoresist;

etching the dummy material using the first patterned photoresist with the first etching process to form a first mandrel, wherein the first etching process is an anisotropic etching process, wherein first etching process forms the first mandrel having a second width, the second width being less than the first width;

after etching the dummy material with the first etching process, removing the first patterned photoresist;

measuring the second width of the first mandrel to generate a second measurement;

setting process parameters for a second etching process based on the measurement of the second width of the first mandrel;

after removing the first patterned photoresist, etching the first mandrel with the second etching process, wherein the second etching process has at least one process parameter different from the first etching process, wherein the second etching process has an etch rate different from the first etching process, wherein the second etching process forms the first mandrel having a third width, wherein the second etching process is an isotropic etching process, wherein the first patterned photoresist is removed by a process different from the first etching process and the second etching process; and measuring the third width of the first mandrel.

2. The method of claim 1, further comprising removing the dummy material using HF as an etchant, wherein the dummy material comprises silicon.

3. The method of claim 1, further comprising:
forming a spacer adjacent to the dummy material after the etching the dummy material with the second etching process, the spacer having a fourth width equal to the third width;
removing the dummy material after forming the spacer;
etching the hardmask after the removing the dummy material; and
etching a gate electrode material using the hardmask after the etching the hardmask.

4. The method of claim 3, further comprising:
forming a second photoresist over the hardmask before etching the hardmask;
removing the second photoresist after etching the hardmask, before etching the gate electrode material; and
forming a third photoresist over the hardmask before etching the gate electrode material, wherein the gate electrode material is located over a fin, the fin comprising a semiconductor material.

5. The method of claim 4, further comprising:
forming a first plurality of fins extending from a substrate, the first plurality of fins comprising the fin; and
forming a second plurality of fins extending from the substrate, a first isolation region being disposed between each of the fins of the first plurality of fins, a second isolation region being disposed between the first plurality of fins and the second plurality of fins, the second isolation region having a height greater than a height of the first isolation region.

6. The method of claim 4, wherein after etching the hardmask, a first sidewall of the hardmask is coterminous with the second photoresist, and wherein the third photoresist physically contacts a top surface and the first sidewall of the hardmask.

7. The method of claim 4, wherein the second photoresist and the third photoresist are not disposed over the fin in a direction perpendicular to a top surface of the fin.

8. A method of manufacturing a semiconductor device, the method comprising:
forming a first set of fins and a second set of fins over a semiconductor substrate;
forming first isolation regions between first fins of the first set of fins, the first isolation regions having a first height;
forming second isolation regions between the first set of fins and the second set of fins, the second isolation regions having a second height greater than the first height;
depositing a gate electrode material over a fin of the first set of fins;
depositing a hard mask over the gate electrode material;
depositing a dummy material over the hard mask;
depositing a photoresist over the dummy material;
patterning the photoresist to form a patterned photoresist having a first width; and
patterning the dummy material, wherein the patterning the dummy material comprises:
etching the dummy material using the patterned photoresist with a first etch process to form a mandrel, the mandrel having a thickness in a first direction orthogonal with a major surface of the semiconductor substrate, wherein etching the dummy material with the first etch process forms the mandrel having a second width in a second direction orthogonal to the first direction, the second width being less than the first width, the first etch process having a first control sensitivity;
after etching the dummy material, removing the patterned photoresist; and
etching the mandrel with a second etch process, the second etch process having a second control sensitivity different from the first control sensitivity, process parameters for the second etch process being based on a measurement of the second width.

9. The method of claim 8, wherein the first etch process is a dry etch process.

10. The method of claim 9, wherein the second etch process is a wet etch process.

11. The method of claim 8, further comprising obtaining measurements of the mandrel after the second etch process.

12. The method of claim 8, wherein the first etch process is a first wet etch process and the second etch process is a second wet etch process.

13. The method of claim 8, further comprising:
forming spacers on opposing sides of the mandrel; and
removing the mandrel.

14. The method of claim 13, further comprising:
etching the hard mask using the spacers as a first mask; and
etching the gate electrode material using the hard mask as a second mask.

15. A method of manufacturing a semiconductor device, the method comprising:
etching a dummy silicon material located over a hardmask and a gate electrode material with a first etch process using a first photoresist as a mask such that the dummy silicon material has a first width parallel to a major surface of the hardmask, wherein the first etch process comprises a reactive ion etch process, the dummy silicon material having a thickness perpendicular to the major surface of the hardmask, the gate electrode material being located over a fin, the first width being less than a second width of the first photoresist parallel to the major surface of the hardmask prior to the etching the dummy silicon material;

after etching the dummy silicon material, removing the first photoresist using a plasma ashing process;

measuring the first width of the dummy silicon material after the first etch process has been finished, the measuring generating measurements; and after removing the first photoresist, etching the dummy silicon material with a second etch process according to a second set of parameters such that the dummy silicon material has a third width parallel to the major surface of the hardmask, the second set of parameters being based at least in part on the measurements, wherein the second etch process has a smaller control sensitivity than the first etch process.

16. The method of claim 15, further comprising:
depositing spacer material on the dummy silicon material after the etching the dummy silicon material with the second etch process;
forming spacers from the spacer material; and
removing the dummy silicon material.

17. The method of claim 16, further comprising:
depositing a second photoresist over a first portion of the hardmask; and
etching the hardmask using the spacers and the second photoresist as masks.

18. The method of claim 17, further comprising:
removing the second photoresist;
depositing a third photoresist over the first portion of the hardmask; and
etching the gate electrode material using the hardmask and the third photoresist as masks.

19. The method of claim 15, wherein the second etch process is a wet etch process.

20. The method of claim 15, wherein the hardmask further comprises:
a layer of silicon nitride; and
a layer of silicon oxide.

* * * * *